United States Patent
Hayakawa et al.

(10) Patent No.: US 7,838,577 B2
(45) Date of Patent: Nov. 23, 2010

(54) ADHESIVE FOR ELECTRONIC COMPONENT

(75) Inventors: Akinobu Hayakawa, Osaka (JP); Hideaki Ishizawa, Osaka (JP); Kohei Takeda, Osaka (JP); Ryohei Masui, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 12/669,081

(22) PCT Filed: Jul. 17, 2008

(86) PCT No.: PCT/JP2008/062906

§ 371 (c)(1),
(2), (4) Date: Apr. 8, 2010

(87) PCT Pub. No.: WO2009/011383

PCT Pub. Date: Jan. 22, 2009

(65) Prior Publication Data

US 2010/0197830 A1    Aug. 5, 2010

(30) Foreign Application Priority Data

Jul. 19, 2007 (JP) ............... 2007-188623

(51) Int. Cl.
*B22F 1/00* (2006.01)
*H01L 21/00* (2006.01)
*C08G 59/50* (2006.01)
*B60C 1/00* (2006.01)

(52) U.S. Cl. ............ 524/1; 438/107; 523/400; 524/493

(58) Field of Classification Search ........ 524/1, 524/493; 438/107; 523/400
See application file for complete search history.

(56) References Cited

U.S. PATENT DOCUMENTS

| 5,733,692 | A | * | 3/1998 | Nagase et al. ............ 430/45.1 |
| 5,827,632 | A | * | 10/1998 | Inaba et al. .............. 430/108.6 |
| 6,242,046 | B1 | * | 6/2001 | Nakane et al. ............ 427/354 |
| 2007/0141499 | A1 | * | 6/2007 | Yamazaki et al. ......... 430/109.3 |
| 2007/0264489 | A1 | * | 11/2007 | Sasabe et al. ............ 428/327 |
| 2008/0227026 | A1 | * | 9/2008 | Oda et al. ............... 430/270.1 |
| 2009/0311827 | A1 | * | 12/2009 | Ishizawa et al. ......... 438/107 |

FOREIGN PATENT DOCUMENTS

| JP | 2000-178342 | 6/2000 |
| JP | 2005-216973 | 8/2005 |
| JP | 2007-169448 | 7/2007 |
| WO | 2008/010555 | 1/2008 |

OTHER PUBLICATIONS

International Search Report issued Oct. 21, 2008 in International (PCT) Application No. PCT/JP2008/062906.

* cited by examiner

*Primary Examiner*—Mark Eashoo
*Assistant Examiner*—Megan McCulley
(74) *Attorney, Agent, or Firm*—Wenderoth, Lind & Ponack, L.L.P.

(57) ABSTRACT

The present invention has its object to provide an adhesive for electronic components, excellent in coatability, having high preventability of stains in bonded electronic components, and capable of providing highly reliable electronic components. The present invention relates to a liquid adhesive for electronic components, containing: a curable compound; a curing agent; and inorganic fine particles, a liquid portion in the liquid adhesive having a solubility parameter (SP value) in the range of 8 to 11 (including 8 and not including 11), the inorganic fine particles including a mixture of at least inorganic fine particles (A) and inorganic fine particles (B), the inorganic fine particles (A) having an average primary particle diameter of 50 nm or less and a hydrophobization degree (M value) in the range of 30 to 50 (including 30 and 50), and the inorganic fine particles (B) having an average primary particle diameter of 50 nm or less and a hydrophobization degree (M value) of 60 or more.

8 Claims, No Drawings

ADHESIVE FOR ELECTRONIC COMPONENT

This application is a U.S. national stage of International Application No. PCT/JP2008/062906 filed Jul. 17, 2008.

TECHNICAL FIELD

The present invention relates to an adhesive for electronic components, excellent in coatability, having high preventability of stains in bonded electronic components, and capable of providing highly reliable electronic components.

BACKGROUND ART

Electronic components such as semiconductor chips have been required to be highly integrated recently, and thus, for example, a plurality of semiconductor chips are bonded via adhesive layers to form a semiconductor chip laminate.

Such a semiconductor chip laminate is produced by the following methods: a method including applying an adhesive to one surface of one semiconductor chip, laminating the other semiconductor chip via the adhesive, and then curing the adhesive; and a method including holding semiconductor chips with a predetermined gap, injecting an adhesive into the gap, and curing the adhesive.

However, upon curing the uncured adhesive in the production of the semiconductor chip laminate, a liquid portion in the adhesive unfortunately leaks from the adhesive, that is, a bleeding phenomenon occurs. When the bleeding phenomenon occurs, the semiconductor chip is stained with the liquid portion bleeding from the adhesive to deteriorate the reliability of the semiconductor chip laminate.

In order to solve such a problem, for example, Patent Document 1 discloses an adhesive containing an epoxy compound with a number average molecular weight of 600 to 1000 used for bonding a plurality of semiconductor chips. According to Patent Document 1, the adhesive can prevent the occurrence of the bleeding phenomenon upon producing a semiconductor chip laminate.

Increasingly smaller semiconductor chips have been required recently, and thus, thinner semiconductor chips are produced. Such thinner semiconductor chips are required to have higher preventability of the bleeding phenomenon in addition to good coatability. However, the adhesive disclosed in Patent Document 1 cannot sufficiently prevent the bleeding phenomenon upon being used for laminating the thinner semiconductor chips; therefore, an adhesive having higher preventability of the occurrence of the bleeding phenomenon is desired.

Patent Document 1: Japanese Kohyo Publication No. 2001-178342 (JP-T 2001-178342)

DISCLOSURE OF THE INVENTION

Problems to be Solved by the Invention

The present invention has its object to provide an adhesive for electronic components, excellent in coatability, having high preventability of stains in bonded electronic components, and capable of providing highly reliable electronic components.

Means for Solving the Problems

A first aspect of the present invention relates to a liquid adhesive for electronic components, containing: a curable compound; a curing agent; and inorganic fine particles. A liquid portion in the liquid adhesive has a solubility parameter (SP value) in the range of 8 to 11 (including 8 and not including 11). The inorganic fine particles include a mixture of at least inorganic fine particles (A) and inorganic fine particles (B). The inorganic fine particles have an average primary particle diameter of 50 nm or less and a hydrophobization degree (M value) in the range of 30 to 50 (including 30 and 50), and the inorganic fine particles (B) have an average primary particle diameter of 50 nm or less and a hydrophobization degree (M value) of 60 or more.

A second aspect of the present invention relates to a liquid adhesive for electronic components, containing: a curable compound; a curing agent; and inorganic fine particles. A liquid portion in the liquid adhesive has a solubility parameter (SP value) in the range of 11 to 12 (including 11 and not including 12). The inorganic fine particles include a mixture of at least inorganic fine particles (C) and inorganic fine particles (D). The inorganic fine particles (C) have an average primary particle diameter of 50 nm or less and a hydrophobization degree (M value) in the range of 10 to 40 (including 10 and 40), and the inorganic fine particles (D) have an average primary particle diameter of 50 nm or less and a hydrophobization degree (M value) of 60 or more.

A third aspect of the present invention relates to a liquid adhesive for electronic components, containing: a curable compound; a curing agent; and inorganic fine particles. A liquid portion in the liquid adhesive has a solubility parameter (SP value) in the range of 12 to 14 (including 12 and 14). The inorganic fine particles include a mixture of at least inorganic fine particles (E) and inorganic fine particles (F). The inorganic fine particles (E) have an average primary particle diameter of 50 nm or less and a hydrophobization degree (M value) of 40 or less, and the inorganic fine particles (F) have an average primary particle diameter of 50 nm or less and a hydrophobization degree (M value) of 50 or more.

In the present description, the liquid portion is a portion obtainable by removing a solid portion from the whole of the present adhesive for electronic components, and generally contains the below-mentioned curable compound and liquid curing agent.

The present invention will be described in detail hereinafter.

The present inventors have found that combination use of inorganic fine particles having hydrophilicity (hydrophobicity) relatively close to hydrophilicity (hydrophobicity) of the liquid portion in the adhesive and inorganic fine particles having hydrophilicity (hydrophobicity) relatively apart from hydrophilicity (hydrophobicity) of the liquid portion in the adhesive makes it possible to produce an adhesive for electronic components capable of sufficiently preventing the occurrence of the bleeding phenomenon while maintaining good coatability, thereby completing the present invention.

Presumably, the inorganic fine particles having hydrophilicity (hydrophobicity) relatively apart from hydrophilicity (hydrophobicity) of the liquid portion in the adhesive form a straight-chain continuum in the adhesive for electronic components of the present invention to give thixotropy suitable for use as an adhesive, and thus play a role of exerting good coatability.

On the other hand, presumably, the inorganic fine particles having hydrophilicity (hydrophobicity) relatively close to hydrophilicity (hydrophobicity) of the liquid portion in the adhesive play a role of preventing exudation of the liquid portion upon applying the adhesive for electronic components of the present invention.

Generally used as an indicator representing hydrophilicity (hydrophobicity) of the liquid portion is solubility parameter (SP value). For bonding electronic components, the SP value of the liquid portion in the adhesive is generally required to be approximately 8 to 14.

The SP value can be obtained by a weighted average of SP values of liquid portions in raw materials. The SP value of each of the raw materials can be obtained by the formula: $\delta^2 = \Sigma E/\Sigma V$. In the formula, $\delta$ represents a SP value, E represents vaporization energy, and V represents a molar volume.

Generally used as an indicator representing hydrophilicity (hydrophobicity) of a filler such as the inorganic fine particles is hydrophobization degree (M value).

The M value represents a methanol concentration (% by weight) of the inorganic fine particles when methanol is dropwise added to an aqueous solution of the inorganic fine particles and the inorganic fine particles are perfectly swelling.

The relationship between the SP value as the indicator of hydrophilicity (hydrophobicity) of the liquid portion and the M value as the indicator of hydrophilicity (hydrophobicity) of the inorganic fine particles is not directly convertible.

However, the present inventors have obtained the following knowledge with respect to the correspondence between the SP value of the liquid portion and the M value of the inorganic fine particles.

The SP value of the liquid portion in the range of 8 to 11 (including 8 and not including 11) and the M value of the inorganic fine particles in the range of 30 to 50 (including 30 and 50) represent relatively close hydrophilicity (hydrophobicity) to each other.

The SP value of the liquid portion in the range of 11 to 12 (including 11 and not including 12) and the M value of the inorganic fine particles in the range of 10 to 40 (including 10 and 40) represent relatively close hydrophilicity (hydrophobicity) to each other.

The SP value of the liquid portion in the range of 12 to 14 (including 12 and 14) and the M value of the inorganic fine particles of 40 or less represent relatively close hydrophilicity (hydrophobicity) to each other.

Therefore, in the adhesive for electronic components of the present invention, the SP value of the liquid portion is categorized in either one of the following three categories: a category in the range of 8 to 11 (including 8 and not including 11); a category in the range of 11 to 12 (including 11 and not including 12); and a category in the range of 12 to 14 (including 12 and 14). The adhesive of the present invention contains the inorganic fine particles having the optimal M value which corresponds to the SP value range.

The adhesive for electronic components according to the first aspect of the present invention contains as the inorganic fine particles a mixture of inorganic fine particles (A) and inorganic fine particles (B) mixed with a liquid portion (hereinafter, also referred to as a "liquid portion (1)"). The inorganic fine particles (A) have an average primary particle diameter of 50 nm or less and a hydrophobization degree (M value) in the range of 30 to 50 (including 30 and 50). The inorganic fine particles (B) have an average primary particle diameter of 50 nm or less and a hydrophobization degree (M value) of 60 or more. The liquid portion (1) has a solubility parameter (SP value) in the range of 8 to 11 (including 8 and not including 11).

In the adhesive for electronic components according to the first aspect of the present invention, the inorganic fine particles (A) play a role of achieving high bleeding preventability and the inorganic fine particles (B) play a role of exerting thixotropy suitable for application of the adhesive upon being mixed with the liquid portion (1).

The liquid portion (1) has the SP value in the range of 8 to 11 (including 8 and not including 11).

A method for setting the SP value of the liquid portion in a predetermined range is not particularly limited. Examples thereof include: a method including appropriately using the below-mentioned curable compound, curing agent, and the like in consideration of the respective SP values of these components; and the like. The most effective method is a method including using the curable compound in consideration of the SP value thereof.

With respect to the adhesive for electronic components according to the first aspect of the present invention, specific examples include a method including using as the curable compound a dicyclopentadiene-type epoxy (SP value: 9 to 10), a butadiene-modified epoxy (SP value: 8 to 10), a silicone-modified epoxy (SP value: 7 to 8), and the like.

The inorganic fine particles (A) and the inorganic fine particles (B) are not particularly limited. Examples thereof include silica fine particles, titanium oxide fine particles, black carbon, and the like. The silica fine particles are suitably used among these.

The upper limit of the average primary particle diameter of each of the inorganic fine particles (A) and the inorganic fine particles (B) is 50 nm. The inorganic fine particles having the average primary particle diameter of more than 50 nm exert insufficient thixotropy to deteriorate the coatability, and also fail to exert the sufficiently high bleeding preventability. The desirable upper limit of the average primary particle diameter is 40 nm, and the more desirable upper limit thereof is 30 nm.

The M value of the inorganic fine particles (A) is in the range of 30 to 50 (including 30 and 50). The inorganic fine particles (A) having the M value deviating from the above range fail to exert the sufficiently high bleeding preventability.

The lower limit of the M value of the inorganic fine particles (B) is 60. The inorganic fine particles (B) having the M value of less than 60 exert insufficient thixotropy to deteriorate the coatability.

A method for setting the M value of each of the inorganic fine particles (A) and the inorganic fine particles (B) in the above range is not particularly limited. Examples thereof include: a method including treating the surface of the inorganic fine particles to change the number of hydrophilic groups present on the surface; and the like. Specific examples of the method include: a method including, in the case of selecting silica fine particles as the inorganic fine particles, adjusting a carbon content by modifying the surface of the silica fine particles with —$CH_3$ to adjust the M value; and the like. The silica fine particles with the carbon content adjusted by such a method are commercially available from TOKUYAMA Corp. or other companies.

Examples of the commercially available products of the inorganic fine particles (A) having the M value of 30 to 50 (including 30 and 50) include: DM-10 (M value: 48, carbon content: 0.9% by weight), MT-10 (M value: 47, carbon content: 0.9% by weight) (each produced by TOKUYAMA Corp.); R-972 (M value: 48) (produced by Degussa AG); silica treated by phenylsilane coupling agent (M value: 30) (produced by Admatechs Co. Ltd.); and the like.

Examples of the commercially available products of the inorganic fine particles (B) having the lower limit of the M value of 60 include: ZD-30ST (M value: 62), HM-20L (M value: 64), and PM-20L (M value: 65, carbon content: 5.5% by weight) (each produced by TOKUYAMA Corp.); RX-200 (M value: 64), and R202 (M value: 65) (each produced by Degussa AG); and the like.

A blending ratio of the inorganic fine particles (A) and the inorganic fine particles (B) is not particularly limited. The desirable lower limit of a blending amount of the inorganic fine particles (B) is 30 parts by weight and the desirable upper limit thereof is 600 parts by weight to 100 parts by weight of the inorganic fine particles (A). The inorganic fine particles (B) with the blending amount of less than 30 parts by weight may exert insufficient thixotropy to deteriorate the coatability, while the inorganic fine particles (B) with the blending amount of more than 600 parts by weight may fail to exert the sufficiently high bleeding preventability. The more desirable lower limit of the blending amount of the inorganic fine particles (B) is 50 parts by weight and the more desirable upper limit thereof is 500 parts by weight.

With respect to the total content of the inorganic fine particles (A) and the inorganic fine particles (B), the desirable lower limit is 2 parts by weight and the desirable upper limit is 20 parts by weight to 100 parts by weight of the curable compound. In the case that the total content of the inorganic fine particles (A) and the inorganic fine particles (B) is less than 2 parts by weight, the bleeding preventability and the thixotropy may be insufficient, while in the case that the total content thereof is more than 20 parts by weight, viscosity may be too high. The more desirable lower limit of the total content of the inorganic fine particles (A) and the inorganic fine particles (B) is 4 parts by weight and the more desirable upper limit thereof is 10 parts by weight.

The adhesive for electronic components according to the second aspect of the present invention contains as the inorganic fine particles a mixture of inorganic fine particles (C) and inorganic fine particles (D) mixed with a liquid portion (hereinafter, also referred to as a "liquid portion (2)"). The inorganic fine particles (C) have an average primary particle diameter of 50 nm or less and a hydrophobization degree (M value) in the range of 10 to 40 (including 10 and 40). The inorganic fine particles (D) have an average primary particle diameter of 50 nm or less and a hydrophobization degree (M value) of 60 or more. The liquid portion (2) has a solubility parameter (SP value) in the range of 11 to 12 (including 11 and not including 12).

In the adhesive for electronic components according to the second aspect of the present invention, the inorganic fine particles (C) play a role of achieving the high bleeding preventability and the inorganic fine particles (D) play a role of exerting the thixotropy suitable for application of the adhesive upon being mixed with the liquid portion (2).

The liquid portion (2) has the SP value in the range of 11 to 12 (including 11 and not including 12).

With respect to the adhesive for electronic components according to the second aspect of the present invention, the SP value of the liquid portion (2) may be adjusted by using the following curable compounds, specifically for example, bisphenol A-type epoxy (SP value: 11), bisphenol F epoxy (SP value: 11), and the like.

The inorganic fine particles (C) and the inorganic fine particles (D) are not particularly limited. Examples thereof include silica fine particles, titanium oxide fine particles, black carbon, and the like. The silica fine particles are suitably used among these.

The upper limit of the average primary particle diameter of each of the inorganic fine particles (C) and the inorganic fine particles (D) is 50 nm. The inorganic fine particles (C) and the inorganic fine particles (D) each having the average primary particle diameter of more than 50 nm exert insufficient thixotropy to deteriorate the coatability and fail to exert the sufficiently high bleeding preventability. The desirable upper limit of the average primary particle diameter of each of the inorganic fine particles (C) and the inorganic fine particles (D) is 40 nm, and the more desirable upper limit thereof is 30 nm.

The M value of the inorganic fine particles (C) is in the range of 10 to 40 (including 10 and 40). The inorganic fine particles (C) having the M value deviating from the above range fail to exert the sufficiently high bleeding preventability.

The lower limit of the M value of the inorganic fine particles (D) is 60. The inorganic fine particles (D) having the M value of less than 60 exert insufficient thixotropy to deteriorate the coatability.

The same method as mentioned above can be used as a method for setting the M value of each of the inorganic fine particles (C) and the inorganic fine particles (D) in the above range.

Examples of the commercially available products of the inorganic fine particles (C) having the M value in the range of 10 to 40 (including 10 and 40) include: UFP-80 (M value: 20) (produced by DENKI KAGAKU KOGYO K.K.); silica treated by phenylsilane coupling agent (M value: 30) (produced by Admatechs Co. Ltd.); and the like.

The commercially available products of the inorganic fine particles (B) can be used as the commercially available products of the inorganic fine particles (D) having the lower limit of the M value of 60.

A blending ratio of the inorganic fine particles (C) and the inorganic fine particles (D) is not particularly limited. The desirable lower limit of a blending amount of the inorganic fine particles (D) is 30 parts by weight and the desirable upper limit thereof is 600 parts by weight to 100 parts by weight of the inorganic fine particles (C). The inorganic fine particles (D) with the blending amount of less than 30 parts by weight may exert insufficient thixotropy to deteriorate the coatability, while the inorganic fine particles (D) with the blending amount of more than 600 parts by weight may fail to exert the sufficiently high bleeding preventability. The more desirable lower limit of the blending amount of the inorganic fine particles (D) is 50 parts by weight and the more desirable upper limit thereof is 500 parts by weight.

With respect to the total content of the inorganic fine particles (C) and the inorganic fine particles (D), the desirable lower limit is 2 parts by weight and the desirable upper limit is 20 parts by weight to 100 parts by weight of the curable compound contained in the adhesive for electronic components according to the first aspect of the present invention. In the case that the total content of the inorganic fine particles (C) and the inorganic fine particles (D) is less than 2 parts by weight, the bleeding preventability and the thixotropy may be insufficient, while in the case that the total content thereof is more than 20 parts by weight, viscosity may be too high. The more desirable lower limit of the total content of the inorganic fine particles (C) and the inorganic fine particles (D) is 4 parts by weight and the more desirable upper limit thereof is 10 parts by weight.

The adhesive for electronic components according to the third aspect of the present invention contains as the inorganic fine particles a mixture of inorganic fine particles (E) and inorganic fine particles (F) mixed with a liquid portion (hereinafter, also referred to as a "liquid portion (3)"). The inorganic fine particles (E) have an average primary particle diameter of 50 nm or less and a hydrophobization degree (M value) of 40 or less. The inorganic fine particles (F) have an average primary particle diameter of 50 nm or less and a hydrophobization degree (M value) of 50 or more. The liquid portion (3) has a solubility parameter (SP value) in the range of 12 to 14 (including 12 and 14).

In the adhesive for electronic components according to the third aspect of the present invention, the inorganic fine particles (E) play a role of achieving the high bleeding preventability and the inorganic fine particles (F) play a role of exerting the thixotropy suitable for application of the adhesive upon being mixed with the liquid portion (3).

The liquid portion (3) has the SP value in the range of 12 to 14 (including 12 and 14).

With respect to the adhesive for electronic components according to the third aspect of the present invention, the SP value of the liquid portion (3) may be adjusted by using the following curable compounds, specifically for example, a naphthalene-type epoxy (SP value: 12), a propylene glycol modified epoxy (SP value: 13), a polyethylene glycol modified epoxy (SP value: 14), and the like.

The inorganic fine particles (E) and the inorganic fine particles (F) are not particularly limited. Examples thereof include silica fine particles, titanium oxide fine particles, black carbon, and the like. The silica fine particles are suitably used among these.

The upper limit of the average primary particle diameter of each of the inorganic fine particles (E) and the inorganic fine particles (F) is 50 nm. The inorganic fine particles (E) and the inorganic fine particles (F) each having the average primary particle diameter of more than 50 nm exert insufficient thixotropy to deteriorate the coatability and fail to exert the sufficiently high bleeding preventability. The desirable upper limit of the average primary particle diameter of each of the inorganic fine particles (E) and the inorganic fine particles (F) is 40 nm, and the more desirable upper limit thereof is 30 nm.

The upper limit of the M value of the inorganic fine particles (E) is 40. The inorganic fine particles (E) having the M value of more than 40 fail to exert the sufficiently high bleeding preventability.

The lower limit of the M value of the inorganic fine particles (F) is 50. The inorganic fine particles (F) having the M value of less than 50 exert insufficient thixotropy to deteriorate the coatability.

The same methods as those for the inorganic fine particles (A) and the inorganic fine particles (B) mentioned above can be used as a method for setting in the above range the M value of each of the inorganic fine particles (E) and the inorganic fine particles (F).

Examples of the commercially available products of the inorganic fine particles (E) having the upper limit of the M value of 40 include QS-40 (M value: 0, the carbon content: 0% by weight) (produced by TOKUYAMA Corp.), and the like.

Examples of the commercially available products of the inorganic fine particles (F) having the lower limit of the M value of 50 include: DM-30 (M value: 52, carbon content: 1.7% by weight), KS-20S (M value: 56, carbon content: 2.0% by weight) (each produced by TOKUYAMA Corp.); R-976 (M value: 52) (produced by Degussa AG); and the like, in addition to those exemplified for the inorganic fine particles (B) mentioned above.

A blending ratio of the inorganic fine particles (E) and the inorganic fine particles (F) is not particularly limited. The desirable lower limit of a blending amount of the inorganic fine particles (F) is 30 parts by weight and the desirable upper limit thereof is 600 parts by weight to 100 parts by weight of the inorganic fine particles (E). The inorganic fine particles (F) with the blending amount of less than 30 parts by weight may exert insufficient thixotropy to deteriorate the coatability, while the inorganic fine particles (F) with the blending amount of more than 600 parts by weight may fail to exert the sufficiently high bleeding preventability. The more desirable lower limit of the blending amount of the inorganic fine particles (F) is 50 parts by weight and the more desirable upper limit thereof is 500 parts by weight.

With respect to the total content of the inorganic fine particles (E) and the inorganic fine particles (F), the desirable lower limit is 2 parts by weight and the desirable upper limit is 20 parts by weight to 100 parts by weight of the curable compound contained in the adhesive for electronic components according to the first aspect of the present invention. In the case that the total content of the inorganic fine particles (E) and the inorganic fine particles (F) is less than 2 parts by weight, the bleeding preventability and the thixotropy may be insufficient, while in the case that the total content thereof is more than 20 parts by weight, viscosity may be too high. The more desirable lower limit of the total content of the inorganic fine particles (E) and the inorganic fine particles (F) is 4 parts by weight and the more desirable upper limit thereof is 10 parts by weight.

The adhesive for electronic components of the present invention contains a curable compound. The curable compound constitutes the liquid portion.

The curable compound is not particularly limited. Examples thereof include compounds curable by reactions such as addition polymerization, polycondensation, polyaddition, addition condensation or ring-opening polymerization. Specific examples thereof include thermosetting compounds such as a urea resin, a melamine resin, a phenol resin, a resorcinol resin, an epoxy resin, an acryl resin, a polyester resin, a polyamide resin, a polybenzimidazole resin, a diallyl phthalate resin, a xylene resin, an alkyl-benzene resin, an epoxy acrylate resin, a silicon resin, and a urethane resin. The epoxy resin is desirable among these because reliability of electronic components such as a semiconductor device obtained after bonding and bond strength are excellent.

The epoxy resin is not particularly limited. The epoxy resin desirably contains a epoxy compound (A) having a molecular structure containing 10 or less monomer units with an aromatic ring in a repeating unit, being in a state of crystalline solid at 25° C., and having a viscosity of 1 Pa·s or less measured by an E-type viscometer at a temperature of 50 to 80° C.

The epoxy compound (A) has a molecular structure containing 10 or less monomer units with an aromatic ring in a repeating unit.

Such an epoxy compound (A) has characteristics that the compound is extremely high crystallizability and the compound is in a state of crystalline solid at 25° C., and its viscosity suddenly decreases at temperatures higher than 25° C. This is presumably because the epoxy compound (A) is in a state of crystalline solid at 25° C. but has a low molecular weight owing to a molecular structure containing 10 or less monomer units, so that the crystalline structure is broken by being heated up to higher than 25° C., resulting in decrease in the viscosity. Specifically, the epoxy compound (A) is in a state of crystalline solid at 25° C. and has the viscosity with the upper limit of 1 Pa·s measured by an E-type viscometer at a temperature of 50 to 80° C. In the case that the epoxy compound (A) has a molecular structure containing more than 10 monomer units, the viscosity at a temperature of 50 to 80° C. is high. Thus, for example, in the case that the adhesive for electronic components of the present invention contains spacer particles mentioned below, it is difficult to laminate electronic components with a substantially same distance as the particle diameter of the spacer particles by using the adhesive for electronic components of the present invention, resulting in variation of the distances between the electronic components. The epoxy compound (A) desirably has a molecular structure containing 3 or less monomer units. The reason why the temperature range with the viscosity being 1 Pa·s is set to 50 to 80° C. is that temperature conditions upon heating and pressurizing electronic components in the general production process of an electronic component laminate are taken into account. Furthermore, the reason why the temperature with the epoxy compound (A) being in a state of crystalline solid is set to 25° C. is that an adhesive for bonding electronic components is generally applied at room temperature.

In the case of using the adhesive for electronic components of the present invention, which contains the epoxy compound (A) having such a molecular structure, that is, a molecular structure containing 10 or less monomer units with an aromatic ring in a repeating unit, for bonding electronic components and the like, the distances between the bonded electronic components can be maintained at high accuracy and a highly reliable electronic component laminate can be obtained.

In other words, since the epoxy compound (A) having an aromatic ring in a repeating unit is in a state of crystalline solid at 25° C., the adhesive for electronic components of the present invention containing the epoxy compound (A) has high viscosity at 25° C., and upon applying the adhesive on electronic components to be bonded, no deformation of the application shape due to flowing occurs. Furthermore, the viscosity of the epoxy compound (A) extremely decreases upon being heated. Thus, for example, in the case that the adhesive for electronic components of the present invention contains spacer particles mentioned below, one electronic component and another electronic component can be laminated with a substantially same distance as the particle diameter of the spacer particles without adhesive residues between the spacer particles and the electronic components upon laminating the electronic components. Furthermore, the viscosity of the epoxy compound (A) extremely increase as a temperature is cooled down to 25° C. after finishing the lamination of the electronic components, so that the adhesive for electronic components of the present invention does not flow after the lamination of the electronic components.

In the case of using a conventional adhesive for electronic components containing spacer particles, a diluent is added to the adhesive in order to decrease viscosity for sufficiently removing adhesive residues between the bonded electronic components and the spacer particles to maintain horizontalness between the electronic components. However, since such a diluent added to the adhesive generally contains a large amount of a volatile constituent, the conventional adhesive with the viscosity being lowered only by adding the diluent causes a problem of occurrence of voids upon being heated to be cured. On the other hand, since the adhesive for electronic components of the present invention containing the epoxy compound (A) can achieve low viscosity upon heating, no voids occur in contrast to the case of using the conventional adhesive with the viscosity being lowered only by adding the diluent. Furthermore, the epoxy compound (A) has excellent heat resistance, so that the adhesive for electronic components of the present invention containing the epoxy compound (A) also has excellent heat resistance.

The epoxy compound (A) desirably has two or more epoxy groups in one molecule. The adhesive for electronic components of the present invention containing the epoxy compound (A) with such a molecular structure can exert more excellent adhesiveness.

The epoxy compound (A) is not particularly limited as long as the epoxy compound (A) has the molecular structure mentioned above. Examples thereof include phenol-type epoxy compounds, naphthalene-type epoxy compounds, biphenyl-type epoxy compounds, and the like. Examples of commercially available products of such an epoxy compound (A) include EX-201 (produced by Nagase & Co., Ltd), YSLV-80XY (produced by Tohto Kasei Co., Ltd.), and the like.

The content of the epoxy compound (A) is not particularly limited. The desirable lower limit is 5 parts by weight and the desirable upper limit is 50 parts by weight to a total of 100 parts by weight of the curable compounds in the adhesive for electronic components of the present invention. The epoxy compound (A) with the content of less than 5 parts by weight may hardly exert the effect of adding the epoxy compound (A), while the epoxy compound (A) with the content of more than 50 parts by weight may cause a failure in obtaining the adhesive for electronic components of the present invention with a viscosity property mentioned below. The more desirable lower limit of the content of the epoxy compound (A) is 10 parts by weight, and the more desirable upper limit thereof is 30 parts by weight.

The adhesive for electronic components of the present invention desirably contains, as the curable compound, an epoxy compound (B) having a flexible skeleton. A cured product of the adhesive for electronic components of the present invention containing the epoxy compound (B) with a flexible skeleton can achieve low elasticity at normal temperatures as well as excellent adhesiveness between the electronic component and a substrate. The "flexible skeleton" herein represents a skeleton which allows a resin consisting of that skeleton to have a grass transition temperature of 25° C. or less.

With respect to the epoxy compound (B) having the flexible skeleton, the molecular weight of the flexible skeleton is not particularly limited. The desirable lower limit thereof in the number average molecular weight is 50 and the desirable upper limit thereof is 1000. The flexible skeleton having the molecular weight of less than 50 may exert insufficient flexibility in the cured product of the adhesive for electronic components of the present invention at normal temperatures, while the flexible skeleton having the molecular weight of more than 1000 may exert insufficient adhesiveness in the adhesive for electronic components of the present invention. The more desirable lower limit of the molecular weight of the flexible skeleton is 100 and the more desirable upper limit thereof is 500.

The epoxy compound (B) desirably has an epoxy group at each end of the molecule and also has a flexible skeleton with the molecular weight in the above range between one of the epoxy groups and the other epoxy group. Such an epoxy compound (B) is not particularly limited. Examples thereof include 1,2-polybutadiene modified bisphenol A glycidyl ether, 1,4-polybutadiene modified bisphenol A glycidyl ether, polypropylene oxide modified bisphenol A glycidyl ether, polyethylene oxide modified bisphenol A glycidyl ether, acrylic rubber modified bisphenol A glycidyl ether, urethane resin modified bisphenol A glycidyl ether, polyester resin modified bisphenol A glycidyl ether, 1,2-polybutadiene modified glycidyl ether, 1,4-polybutadiene modified glycidyl ether, polypropylene oxide modified glycidyl ether, polyethylene oxide modified glycidyl ether, acrylic rubber modified glycidyl ether, urethane resin modified glycidyl ether, polyester resin modified glycidyl ether, hydrogenated products thereof, and the like. Each of these epoxy compounds (B) may be used alone, or two or more of these may be used in combination. Suitably used among these is an epoxy compound (B) having a flexible skeleton derived from at least one compound selected from the group consisting of butadiene rubber, propylene oxide, ethylene oxide, acrylic rubber, and hydrogenated products thereof.

Furthermore, in view of achieving a high reaction velocity, the following epoxy compound (B) is suitably used, for example: epoxy compounds (B) having an aromatic skeleton, such as 1,2-polybutadiene modified bisphenol A glycidyl ether, 1,4-polybutadiene modified bisphenol A glycidyl ether, polypropylene oxide modified bisphenol A glycidyl ether, polyethylene oxide modified bisphenol A glycidyl ether, acrylic rubber modified bisphenol A glycidyl ether, urethane resin modified bisphenol A glycidyl ether, and polyester resin modified bisphenol A glycidyl ether.

Of the above epoxy compounds (B), one in which an aromatic ring and a glycidyl group directly bond to each other is more desirable because of its higher reaction velocity. Examples of commercially available products of such an epoxy compound (B) include EPB-13 (produced by Nippon Soda Co., Ltd.), EXA-4850 (produced by Dainippon Ink and Chemicals, Incorporated), and the like.

The content of the epoxy compound (B) is not particularly limited. The desirable lower limit is 5 parts by weight and the desirable upper limit is 30 parts by weight to a total of 100 parts by weight of the curable compounds in the adhesive for electronic components of the present invention. The epoxy compound (B) with the content of less than 5 parts by weight may hardly exert the effect of adding the epoxy compound (B), while the epoxy compound (B) with the content of more than 30 parts by weight may cause a failure in obtaining the adhesive for electronic components of the present invention with a viscosity property mentioned below. The more desirable lower limit of the content of the epoxy compound (B) is 10 parts by weight, and the more desirable upper limit thereof is 20 parts by weight.

The adhesive for electronic components of the present invention may contain another epoxy compound (C) as the curable compound. To contain such an epoxy compound (C) makes it possible to adjust the viscosity and the glass transition temperature of the adhesive for electronic components of the present invention.

The epoxy compound (C) is not particularly limited. Examples thereof include a bisphenol A-type epoxy compound, a bisphenol F-type epoxy compound, and the like.

The content of the epoxy compound (C) is not particularly limited. The desirable lower limit is 10 parts by weight and the desirable upper limit is 60 parts by weight to a total of 100 parts by weight of the curable compounds in the adhesive for electronic components of the present invention. The epoxy compound (C) with the content of less than 10 parts by weight may hardly exert the effect of adding the epoxy compound (C), while the epoxy compound (C) with the content of more than 60 parts by weight may cause a failure in obtaining the adhesive for electronic components of the present invention with a viscosity property mentioned below. The more desirable lower limit of the content of the epoxy compound (C) is 20 parts by weight, and the more desirable upper limit thereof is 30 parts by weight.

The adhesive for electronic components of the present invention contains a curing agent. The curing agent constitutes the liquid portion mentioned above.

The curing agent is not particularly limited; examples thereof include amine-type curing agents, acid anhydride curing agents, phenol-type curing agents, and the like. The acid anhydrides can be suitably used among these.

The acid anhydride is not particularly limited. Bifunctional acid anhydride curing agents in a liquid state at normal temperatures are suitably used.

The bifunctional acid anhydride curing agent in a liquid state at normal temperatures is not particularly limited. Examples of the bifunctional acid anhydride include phthalic anhydride, hexahydrophthalic anhydride, methyl tetrahydrophthalic anhydride, methyl hexahydrophthalic anhydride, endomethylene tetrahydrophthalic anhydride, methylendomethylene tetrahydrophthalic anhydride, maleic anhydride, and the like.

The adhesive for electronic components of the present invention may contain, as the curing agent, tri- or more functional acid anhydride curing agent particles in a solid state at normal temperatures. Advantageously, the adhesive for electronic components of the present invention containing such tri- or more functional acid anhydride curing agent particles in a solid state at normal temperatures has a sea-island structure including a sea portion with low elasticity and an island portion with high elasticity. Thus, the adhesive for electronic components of the present invention has appropriate flexibility at high temperatures and excellent adhesiveness between the electronic component such as a semiconductor chip and a substrate, and can prevent the electronic component bonded to the substrate from greatly warping.

The tri- or more functional acid anhydride curing agent in a solid state at normal temperatures is not particularly limited. Examples of the trifunctional acid anhydride curing agent include trimellitic anhydride, and the like. Examples of the tetra- or more functional acid anhydride curing agent include pyromellitic anhydride, benzophenone tetracarboxylic anhydride, methylcyclohexene tetracarboxylic anhydride, polyazelaic anhydride, and the like.

The desirable lower limit of the melting point of the tri- or more functional acid anhydride curing agent particles is 80° C. In the case that the melting point is less than 80° C., the particles may be in a liquid state at relatively low temperatures to spread into the adhesive for electronic components of the present invention unless particles having low compatibility with the curable compound are selected. The particles having a melting point of less than 80° C. can be also used in the case of selecting the particles having low compatibility with the curable compound.

With respect to an average particle diameter of the tri- or more functional acid anhydride curing agent particles, the desirable lower limit is 0.1 μm and the desirable upper limit is 10 μm. The tri- or more functional acid anhydride curing agent particles having the average particle diameter of less than 0.1 μm may make the island portions too small even though the sea-island structure can be formed after curing, resulting in a failure in exerting high elasticity at high temperatures. The tri- or more functional acid anhydride curing agent particles having the average particle diameter of more than 10 μm may make the island portions too large after curing, resulting in lack of flexibility at normal temperatures and a failure in preventing the electronic components such as a semiconductor chip from warping.

The content of the curing agent in the adhesive for electronic components of the present invention is not particularly limited. The desirable lower limit is 30 parts by weight and the desirable upper limit is 70 parts by weight to a total of 100 parts by weight of the curable compounds in the adhesive for electronic components of the present invention. The curing agent with the content of less than 30 parts by weight may cause the adhesive for electronic components of the present invention to be insufficiently cured, while the curing agent with the content of more than 70 parts by weight may deteriorate connecting reliability of the adhesive for electronic components of the present invention. The more desirable lower limit of the content of the curing agent is 40 parts by weight and the more desirable upper limit thereof is 60 parts by weight.

In the case that the curing agent contains the bifunctional acid anhydride curing agent in a liquid state at normal temperatures and the tri- or more functional acid anhydride curing agent in a solid state at normal temperatures, the blending ratio of these is not particularly limited. The desirable lower limit value obtained by dividing a blending amount (weight) of the tri- or more functional acid anhydride curing agent particles by a blending amount (weight) of the bifunctional acid anhydride curing agent in a liquid state at normal temperatures is 0.1 and the desirable upper limit value obtained thereby is 10. In the case that the value obtained by dividing the blending amount (weight) of the tri- or more functional acid anhydride curing agent particles by the blending amount (weight) of the bifunctional acid anhydride curing agent in a liquid state at normal temperatures is less than 0.1, the island portions mentioned above may not be formed in the cured product of the adhesive for electronic components of the present invention, while in the case that the value is more than 10, strength of the whole cured product may be insufficient. The more desirable lower limit value obtained by dividing the blending amount (weight) of the tri- or more functional acid anhydride curing agent particles by the blending amount (weight) of the bifunctional acid anhydride curing agent in a liquid state at normal temperatures is 0.2 and the more desirable upper limit value obtained thereby is 5.

The adhesive for electronic components of the present invention desirably further contains a curing accelerator so as to adjust curing speed and physical properties of the cured product.

The curing accelerator is not particularly limited. Examples thereof include an imidazole-type curing accelerator, a tertiary amine-type curing accelerator, and the like. The imidazole-type curing accelerator is suitably used among these because it is easy to control a reaction system for adjusting curing speed and physical properties of the cured product. Each of these curing accelerators may be used alone, or two or more of these may be used in combination.

The imidazole-type curing accelerator is not particularly limited. Examples thereof include: 1-cyanoethyl-2-phenylimidazole with the 1-position of imidazole protected by a cyanoethyl group; a substance with its basicity protected by isocyanuric acid (trade name "2MA-OK", produced by SHIKOKU CHEMICALS Corp.); and the like. Each of these imidazole-type curing accelerator may be used alone, or two or more of these may be used in combination.

A blending amount of the curing accelerator is not particularly limited. The desirable lower limit thereof is 1 part by weight and the desirable upper limit thereof is 20 parts by weight to a total of 100 parts by weight of the curable compounds in the adhesive for electronic components of the present invention. The curing accelerator with the blending amount of less than 1 part by weight may cause the adhesive for electronic components of the present invention to be insufficiently cured, while the curing accelerator with the blending amount of more than 20 parts by weight may deteriorate bonding reliability of the adhesive for electronic components of the present invention.

The adhesive for electronic components of the present invention desirably further contains spacer particles having a CV value of 10% or less.

In the case of, for example, bonding two or more electronic components with the adhesive for electronic components of the present invention containing such spacer particles, the distance between the electronic components to be bonded can be precisely adjusted to the size of the particle diameter of the spacer particles.

The upper limit of the CV value of the spacer particles is 10%. In the case that the CV value of the spacer particles is more than 10%, wide variation occurs in the particle diameter, and thus, it is difficult to maintain the constant distance between the electronic components, and the spacer particles cannot sufficiently exert their function. The desirable upper limit of the CV value of the spacer particles is 6%, and the more desirable upper limit of the CV value of the spacer particles is 4%.

The CV value herein is a value obtained by the following formula (1):

$$CV \text{ value of particle diameter}(\%) = (\sigma 2/Dn2) \times 100 \quad (1)$$

wherein σ2 represents a standard deviation of the particle diameter and Dn2 represents a number average particle diameter.

An average particle diameter of the spacer particles is not particularly limited as long as the electronic components are allowed to have a predetermined distance. The desirable lower limit thereof is 5 μm and the desirable upper limit thereof is 200 μm. In the case that the spacer particles have the average particle diameter of less than 5 μm, it may be difficult to narrow the distance between the electronic components to the similar size of the particle diameter of the spacer particles, while in the case that the spacer particles have the average particle diameter of more than 200 μm, electronic components may have the distance wider than required. The more desirable lower limit of the average particle diameter of the spacer particles is 9 μm and the more desirable upper limit thereof is 50 μm.

The average particle diameter of the spacer particles is desirably 1.1 or more times larger than the average particle diameter of the solid portions added to the adhesive in addition to the spacer particles. In the case that the average particle diameter of the spacer particles is less than 1.1 times larger than the average particle diameter of the solid portions, it may be difficult to reliably narrow the distance between the electronic components to the similar size of the particle diameter of the spacer particles. The average particle diameter of the spacer particles is more desirably 1.2 or more times larger than the average particle diameter of the solid portions.

The standard deviation of the particle diameter distribution of the spacer particles is desirably 10% or less of the average particle diameter of the spacer particles. In the case that the standard deviation of the particle diameter distribution of the spacer particles is 10% or less of the average particle diameter of the spacer particles, the electronic components can be horizontally laminated with greater stability.

With respect to a K value of the spacer particles represented by the following formula (2), the desirable lower limit is 980 N/mm² and the desirable upper limit is 4900 N/mm²;

$$K = (3/\sqrt{2}) \cdot F \cdot S^{-3/2} \cdot R^{-1/2} \quad (2)$$

wherein F represents a load value (kgf) of resin fine particles in 10% compressive deformation, S represents a compression displacement (mm) of resin fine particles in 10% compressive deformation, and R represents a radius (mm) of the spacer.

The K value can be measured by the following method.

First, particles are dispersed on a steel plate having a flat surface, and then one fine particle selected from among the particles is compressed by a flat end face of a diamond round pillar with a diameter of 50 μm using a micro compression testing apparatus. Upon the compression, a compression load is electrically detected as an electromagnetic force and a compression displacement is electrically detected as a displacement by a differential transformer. Then, a load value and a compression displacement in 10% compressive deformation are obtained from the obtained compression displacement-load relationship, and the K value is calculated from the obtained result.

The desirable lower limit of a compression recovery rate upon releasing the spacer particles from the 10% compressive deformation state at 20° C. is 20%. In the case of using the spacer particles having such a compression recovery rate, even a particle having a particle diameter larger than the average particle diameter can serve as a gap adjuster through recovery of its shape by compressive deformation between the laminated electronic components. Thus, the electronic components can be horizontally laminated with greater stability with a predetermined distance therebetween.

The compression recovery rate can be measured by the following method.

As in the same method for measuring the K value, a compression displacement is electrically detected as a displacement by a differential transformer. The spacer particles are compressed to a reverse load value, and then gradually released from the load. The relationship between the load and the compression displacement at that time is measured. The compression recovery rate is calculated from the obtained measuring result. The terminal load value of the compression release is not zero but the original load value of 0.1 g or more.

A material of the spacer particles is not particularly limited, but is desirably resin particles. A resin for the resin particles is not particularly limited. Examples thereof include polyethylene, polypropylene, polymethyl pentene, polyvinyl chloride, polytetrafluoro ethylene, polystyrene, polymethyl (meth) acrylate, polyethylene terephthalate, polybutylene terephthalate, polyamide, polyimide, polysulfone, polyphenylene oxide, polyacetal, and the like. Crosslinked resins thereof are desirably used because, by using such resins, it is easy to adjust hardness and the recovery rate of the spacer particles and to improve heat resistance of the spacer particles. The (meth)acrylate herein represents an acrylate or a methacrylate.

The crosslinked resin is not particularly limited. Examples thereof include resins having a mesh structure, such as an epoxy resin, a phenol resin, a melamine resin, an unsaturated polyester resin, a divinylbenzene polymer, a divinylbenzene-styrene copolymer, a divinylbenzene-acrylate copolymer, a diallyl phthalate polymer, a triallyl isocyanurate polymer, and a benzoguanamine polymer. The divinylbenzene polymer, the divinylbenzene-styrene-type copolymer, the divinylbenzene-(meth)acrylate copolymer, the diallyl phthalate polymer and the like are desirably used among these. The adhesive containing these has excellent resistance to heat treatments such as a curing process and a solder reflowing process after chip bonding.

Desirably, the surface of the spacer particles is optionally treated.

The adhesive for electronic components of the present invention can exert the below-mentioned viscosity characteristic by containing the spacer particles with the surface treated.

The surface treating method is not particularly limited. A hydrophilic group is desirably imparted to the surface in the case that the whole of the adhesive for electronic components of the present invention has hydrophobicity. A method for imparting the hydrophilic group is not particularly limited. Examples thereof include, in the case of using the resin particles as the spacer particles, a method including treating the surface of the resin particles with a hydrophilic group-containing coupling agent.

The spacer particles desirably have a spherical shape. The desirable upper limit of the aspect ratio of the spacer particles is 1.1. The spacer particles having the aspect ratio of 1.1 or less can allow electronic components to be stably laminated with a predetermined distance therebetween. The aspect ratio herein represents a ratio of the major axis length to the minor axis length of the particles (the value obtained by dividing the length of the major axis by the length of the minor axis). The spacer particles having the aspect ratio closer to 1 have a shape closer to the perfect sphere.

A blending amount of the spacer particles is not particularly limited. The desirable lower limit is 0.01% by weight and the desirable upper limit is 10% by weight. The spacer particles with the blending amount of less than 0.01% by weight may fail to accurately adjust a distance between electronic components to be bonded, while the spacer particles with the blending amount of more than 10% by weight may deteriorate bonding reliability of the adhesive for electronic components of the present invention.

In the case that the adhesive contains a solid portion having a diameter larger than or equal to the average particle diameter of the spacer particles in addition to the spacer particles, the desirable upper limit of a blending amount of the solid portion is 1% by weight. The melting point of the solid portion is desirably less than or equal to a curing temperature.

Furthermore, the maximum particle diameter of the solid portion is desirably 1.1 to 1.5 times, and more desirably 1.1 to 1.2 times, larger than the average particle diameter of the spacer particles.

The adhesive for electronic components of the present invention may contain a diluent to the extent that the diluent does not inhibit the effect of the present invention. The diluent is desirably a kind of reactive diluents which is incorporated into the cured product upon heat curing the adhesive for electronic components of the present invention. Desirably used among these is a diluent having two or more functional groups in one molecule so as not to deteriorate bonding reliability of the cured product.

Examples of such a reactive diluent include an aliphatic-type epoxy, an ethylene oxide modified epoxy, propylene oxide modified epoxy, a cyclohexane-type epoxy, a dicyclopentadiene-type epoxy, a phenol-type epoxy, and the like.

In the case that the adhesive for electronic components of the present invention contains the diluent, the content thereof is not particularly limited. The desirable lower limit is 1 part by weight and the desirable upper limit is 50 parts by weight to a total of 100 parts by weight of the curable compounds in the adhesive for electronic components of the present invention. The diluent with the content of less than 1 part by weight may hardly exert the effect of adding the diluent in some cases, while the diluent with the content of more than 50 parts by weight may deteriorate bonding reliability of the adhesive for electronic components of the present invention and cause a failure in obtaining the below-mentioned viscosity characteristic. The more desirable lower limit of the content of the diluent is 5 parts by weight and the more desirable upper limit thereof is 20 parts by weight.

The adhesive for electronic components of the present invention may optionally contain a solvent.

The solvent is not particularly limited. Examples thereof include aromatic hydrocarbons, chlorinated aromatic hydrocarbons, chlorinated aliphatic hydrocarbons, alcohols, esters, ethers, ketones, glycolethers (cellosolves), cycloaliphatic hydrocarbons, aliphatic hydrocarbons, and the like.

With respect to the adhesive for electronic components of the present invention, the desirable lower limit of the viscosity is 20 Pa·s and the desirable upper limit thereof is 1000 Pa·s at 0.5 rpm upon measuring the viscosity at 25° C. with an E-type viscometer. The adhesive for electronic components of the present invention having the viscosity of less than 20 Pa·s may lack shape retentivity, while the adhesive having the viscosity of more than 1000 Pa·s may lack discharging stability.

Furthermore, in the case that the viscosity of the adhesive for electronic components of the present invention measured at 25° C. and 5 rpm with an E-type viscometer is defined as $T_1$ and the viscosity thereof measured at 25° C. and 5 rpm with an E-type viscometer is defined as $T_2$, the desirable lower limit of $T_2/T_1$ is 2 and the desirable upper limit thereof is 8. The adhesive for electronic components of the present invention with the $T_2/T_1$ in the above range has thixotropy suitable for application.

The adhesive for electronic components of the present invention can be produced by, for example, a method for blending and mixing a predetermined amount of the curable compound, curing agent, and inorganic fine particles and optionally curing accelerator, diluent, and other additives, and then blending the spacer particles in the case of blending these particles.

The mixing method is not particularly limited. Examples thereof include a method using a homodisper, utility mixer, Banbury mixer, kneader, and the like.

An electronic component device can be produced by multi-laminating two or more electronic components with the adhesive for electronic components of the present invention and then sealing with a sealant and the like.

The adhesive for electronic components of the present invention can be suitably used not only for laminating two or more electronic components but also for mounting electronic components on a substrate and for bonding components such as a sensor.

In the case that 0.2 mg of the adhesive for electronic components of the present invention is applied to a silicon wafer mirror face to form a circular adhesive layer with a diameter of 500 μm and then the adhesive layer is cured at 170° C. for 10 minutes to form a cured product, exudation distance of the liquid portion from the cured adhesive is desirably less than 50 μm. In the case that the exudation distance of the liquid portion is 50 μm or more, the adhesive for electronic components of the present invention cannot sufficiently prevent the bleeding phenomenon upon bonding electronic components. Thus, highly reliable electronic components cannot be obtained, resulting in failure in sufficient correspondence to the recent demand for miniaturization and high accumulation of electronic components. The desirable upper limit of the exudation distance is 30 μm and the more desirable upper limit thereof is 10 μm.

The exudation distance represents a length of a different-color portion existing around the cured product of the adhesive toward the center upon observing the cured product of the adhesive with an optical microscope.

In the case that the exudation distance of the liquid portion from the cured product of the adhesive for electronic components of the present invention satisfies the above condition, this case is also represented as "exerting the (sufficiently) high bleeding preventability".

In the case of multi-laminating two or more electronic components with the adhesive for electronic components of the present invention containing the spacer particles, the distance between the electronic components is desirably 1 to 1.5 times of the diameter of the spacer particles. In the case that the distance between the electronic components is less than the particle diameter of the spacer particles, the adhesive for electronic components of the present invention between the spacer particles and the electronic components may not be removed and the distance between the electronic components cannot be adjusted by the spacer particles, and thus variation in height may occur. In the case that the distance between the electronic components is more than 1.5 times of the diameter of the spacer particles, the distance between the electronic components cannot be adjusted by the particle diameter of the spacer particles, and thus variation in height may be wide. The distance between the electronic components is desirably equal to the diameter of the spacer particles. In the case that the distance between the electronic components is equal to the particle diameter of the spacer particles, the adhesive for electronic components of the present invention between the spacer particles and the electronic components can be suitably removed and the distance between the electronic components can be suitably adjusted by the spacer particles, and thus variation in height can be prevented.

The electronic component to be bonded with the adhesive for electronic components of the present invention is not particularly limited. Examples thereof include a semiconductor chip, a sensor, an iron-core coil, and the like. The adhesive is suitably used for laminating semiconductor chips and for forming an iron-core coil gap for transformer components.

The iron-core coil for transformer components is not particularly limited and an EI type, EE type, and the like can be suitably used.

Effects of the Invention

The present invention can provide an adhesive for electronic components, excellent in coatability, having high preventability of stains in bonded electronic components, and capable of providing highly reliable electronic components.

BEST MODE FOR CARRYING OUT THE INVENTION

The present invention will be further described hereinafter with reference to examples, but the present invention is not limited to these examples.

Examples 1 to 6, Comparative Examples 1 to 9

Materials as shown in Tables 1 and 2 were mixed under stirring with a homodisper to prepare an adhesive for electronic components according to each of Examples 1 to 6 and Comparative Examples 1 to 9.

A SP value of the whole liquid portion in each of the examples and the comparative examples was obtained by a weighted average of SP values of each of the liquid portions. The SP value of each of the raw materials was obtained by the formula: $\delta^2 = \Sigma E/\Sigma V$. In the formula, δ represents a SP value, E represents a vaporization energy, and V represents a molar volume.

(Evaluation)

The adhesive for electronic components according to each of Examples 1 to 6 and Comparative Examples 1 to 9 was evaluated in the following manner.

Table 1 and 2 show the results.

(1) Evaluation of Bleeding Amount

The adhesive for electronic components prepared in each of the examples and comparative examples was applied on a silicon wafer to form a circular adhesive layer with a diameter of 500 μm. Then, the adhesive layer was cured in an oven at 170° C. for 10 minutes to form a cured product.

A bleeding distance of the liquid portion of the obtained cured product was measured with an optical microscope. The bleeding distance on one side being 50 μm or less was evaluated as "o", while the distance of more than 50 μm was evaluated as "x".

(2) Evaluation of Coatability

The adhesive for electronic components prepared in each of the examples and comparative examples was applied on a silicon chip so as to form 100 dots with an air dispenser (produced by Musashi Engineering, Inc.). In the case that the average dot size was set in the range of 400 to 600 μm, the difference of less than 100 μm between the maximum dot size and the minimum dot size was evaluated as "o", while the difference of 100 μm or more between the maximum dot size and the minimum dot size was evaluated as "x".

(3) Comprehensive Evaluation

In the case that both of the evaluations (1) and (2) were evaluated as "o", the comprehensive evaluation was evaluated as "o", while in the case that at least one of the evaluations (1) and (2) was evaluated as "x", the comprehensive evaluation was evaluated as "x".

TABLE 1

| | | | Example 1 | Example 2 | Example 3 | Example 4 | Example 5 | Example 6 |
|---|---|---|---|---|---|---|---|---|
| Composition (parts by weight) | Curable compound | Dicyclopentadiene-type epoxy EP-4088S | 3 | 3 | 5 | 5 | — | — |
| | | Dicyclopentadiene-type epoxy HP-7200HH | — | — | 5 | 5 | — | — |
| | | Resorcinol-type epoxy compound EX-201 | — | — | — | — | 3 | 3 |
| | | NBR modified bis A-type epoxy compound EPR-4030 | — | — | — | — | 7 | 7 |
| | | Butadiene modified epoxy R-45EPT | 7 | 7 | — | — | — | — |
| | Curing agent | Bifunctional acid anhydride curing agent YH-306 | — | — | 5 | 5 | 5 | 5 |
| | Curing accelerator | Imidazole curing accelerator 2MA-OK | 0.8 | 0.8 | 0.8 | 0.8 | 0.8 | 0.8 |
| | SP value of liquid portion | | 8 | 8 | 9 | 9 | 10 | 10 |
| | Inorganic fine particles | Surface phenyl group-treated nanosilica (M value: 30) | — | 0.2 | — | 0.3 | — | 0.3 |
| | | Fumed silica (MT-10, M value: 47) | 0.2 | — | 0.3 | — | 0.3 | — |
| | | Fumed silica (PM-20L, M value: 65) | 0.2 | 0.2 | 0.3 | 0.3 | 0.3 | 0.3 |
| Evaluation | | Bleeding amount | o | o | o | o | o | o |
| | | Coatability | o | o | o | o | o | o |
| | | Comprehensive evaluation | o | o | o | o | o | o |

TABLE 2

| | | | Comparative Example 1 | Comparative Example 2 | Comparative Example 3 | Comparative Example 4 | Comparative Example 5 |
|---|---|---|---|---|---|---|---|
| Composition (parts by weight) | Curable compound | Dicyclopentadiene-type epoxy EP-4088S | 3 | 3 | 3 | 5 | 5 |
| | | Dicyclopentadiene-type epoxy HP-7200HH | — | — | — | 5 | 5 |
| | | Resorcinol-type epoxy compound EX-201 | — | — | — | — | — |
| | | NBR modified bis A-type epoxy compound EPR-4030 | — | — | — | — | — |
| | | Butadiene modified epoxy R-45EPT | 7 | 7 | 7 | — | — |
| | Curing agent | Bifunctional acid anhydride curing agent YH-306 | — | — | — | 5 | 5 |
| | Curing accelerator | Imidazole curing accelerator 2MA-OK | 0.8 | 0.8 | 0.8 | 0.8 | 0.8 |
| | SP value of liquid portion | | 8 | 8 | 8 | 9 | 9 |
| | Inorganic fine particles | Surface epoxy group-treated nanosilica (UFP-80, M value: 20) | — | 0.2 | — | — | 0.3 |
| | | Surface phenyl group-treated nanosilica (M value: 30) | — | — | 0.2 | — | — |
| | | Fumed silica (MT-10, M value: 47) | — | — | 0.2 | — | — |
| | | Fumed silica (HM-20L, M value: 64) | 0.2 | — | — | 0.3 | — |
| | | Fumed silica (PM-20L, M value: 65) | 0.2 | 0.2 | — | 0.3 | 0.3 |

TABLE 2-continued

| Evaluation | | | Bleeding amount | x | x | ○ | x | x |
|---|---|---|---|---|---|---|---|---|
| | | | Coatability | ○ | ○ | x | ○ | ○ |
| | | | Comprehensive evaluation | x | x | x | x | x |

| | | | | Comparative Example 6 | Comparative Example 7 | Comparative Example 8 | Comparative Example 9 |
|---|---|---|---|---|---|---|---|
| Composition (parts by weight) | Curable compound | Dicyclopentadiene-type epoxy EP-4088S | | 5 | — | — | — |
| | | Dicyclopentadiene-type epoxy HP-7200HH | | 5 | — | — | — |
| | | Resorcinol-type epoxy compound EX-201 | | — | 3 | 3 | 3 |
| | | NBR modified bis A-type epoxy compound EPR-4030 | | — | 7 | 7 | 7 |
| | | Butadiene modified epoxy R-45EPT | | — | — | — | — |
| | Curing agent | Bifunctional acid anhydride curing agent YH-306 | | 5 | 5 | 5 | 5 |
| | Curing accelerator | Imidazole curing accelerator 2MA-OK | | 0.8 | 0.8 | 0.8 | 0.8 |
| | SP value of liquid portion | | | 9 | 10 | 10 | 10 |
| | Inorganic fine particles | Surface epoxy group-treated nanosilica (UFP-80, M value: 20) | | — | — | 0.3 | — |
| | | Surface phenyl group-treated nanosilica (M value: 30) | | 0.3 | — | — | 0.3 |
| | | Fumed silica (MT-10, M value: 47) | | 0.3 | — | — | 0.3 |
| | | Fumed silica (HM-20L, M value: 64) | | — | 0.3 | — | — |
| | | Fumed silica (PM-20L, M value: 65) | | — | 0.3 | 0.3 | — |
| Evaluation | | Bleeding amount | | ○ | x | x | ○ |
| | | Coatability | | x | ○ | ○ | x |
| | | Comprehensive evaluation | | x | x | x | x |

Examples 7 and 8, Comparative Examples 10 to 12

Materials as shown in Table 3 were mixed under stirring with a homodisper to prepare an adhesive for electronic components according to each of Examples 7 and 8 and Comparative Examples 10 to 12. The evaluations were carried out in the same manner.

A SP value of the whole liquid portion in each of the examples and the comparative examples was obtained by a weighted average of SP values of each of the liquid portions. The SP value of each of the raw materials was obtained by the formula: $\delta^2 = \Sigma E / \Sigma V$. In the formula, $\delta$ represents a SP value, E represents a vaporization energy, and V represents a molar volume.

TABLE 3

| | | | Example 7 | Example 8 | Comparative Example 10 | Comparative Example 11 | Comparative Example 12 |
|---|---|---|---|---|---|---|---|
| Composition (parts by weight) | Curable compound | Bisphenol A-type epoxy YL-980 | 5 | 5 | 5 | 5 | 5 |
| | | Resorcinol-type epoxy compound EX-201 | 5 | 5 | 5 | 5 | 5 |
| | Curing agent | Bifunctional acid anhydride curing agent YH-306 | 5 | 5 | 5 | 5 | 5 |
| | Curing accelerator | Imidazole curing accelerator 2MA-OK | 0.8 | 0.8 | 0.8 | 0.8 | 0.8 |
| | SP value of liquid portion | | 11 | 11 | 11 | 11 | 11 |
| | Inorganic fine particles | Fumed silica (QS-40, M value: 0) | — | — | — | 0.3 | — |
| | | Surface epoxy group-treated nanosilica (UFP-80, M value: 20) | 0.3 | — | — | — | 0.3 |
| | | Surface phenyl group-treated nanosilica (M value: 30) | — | 0.3 | — | — | — |
| | | Fumed silica (MT-10, M value: 47) | — | — | 0.3 | — | 0.3 |
| | | Fumed silica (PM-20L, M value: 65) | 0.3 | 0.3 | 0.3 | 0.3 | — |
| Evaluation | | Bleeding amount | ○ | ○ | x | x | ○ |
| | | Coatability | ○ | ○ | ○ | ○ | x |
| | | Comprehensive evaluation | ○ | ○ | x | x | x |

Examples 9 to 14, Comparative Examples 13 to 18

Material as shown in Tables 4 and 5 were mixed under stirring with a homodisper to prepare an adhesive for electronic components according to each of Examples 9 to 14 and Comparative Examples 13 to 18. The evaluations were carried out in the same manner.

A SP value of the whole liquid portion in each of the examples and the comparative examples was obtained by a weighted average of SP values of each of the liquid portions. The SP value of each of the raw materials was obtained by the formula: $\delta^2 = \Sigma E/\Sigma V$. In the formula, $\delta$ represents a SP value, E represents a vaporization energy, and V represents a molar volume.

TABLE 4

|  |  |  | Example 9 | Example 10 | Example 11 | Example 12 | Example 13 | Example 14 |
|---|---|---|---|---|---|---|---|---|
| Composition (parts by weight) | Curable compound | Polyether modified epoxy EX-861 | — | — | — | — | 10 | 10 |
|  |  | Polytetramethylene glycol modified epoxy (Epo gosei PT) | — | — | 2 | 2 | — | — |
|  |  | Resorcinol-type epoxy compound EX-201 | 7 | 7 | — | — | — | — |
|  |  | Flexible epoxy EXA-4850-150 | — | — | 8 | 8 | — | — |
|  |  | Flexible epoxy EXA-4850-1000 | 3 | 3 | — | — | — | — |
|  | Curing agent | Bifunctional acid anhydride curing agent YH-306 | 5 | 5 | — | — | — | — |
|  | Curing accelerator | Imidazole curing accelerator 2MA-OK | 0.8 | 0.8 | 0.8 | 0.8 | 0.8 | 0.8 |
|  | SP value of liquid portion |  | 12 | 12 | 13 | 13 | 14 | 14 |
|  | Inorganic fine particles | Fumed silica (QS-40, M value: 0) | 0.3 | — | 0.2 | — | 0.2 | — |
|  |  | Surface phenyl group-treated nanosilica (M value: 30) | — | 0.3 | — | 0.2 | — | 0.2 |
|  |  | Fumed silica (HM-20L, M value: 64) | 0.3 | 0.3 | 0.2 | 0.2 | 0.2 | 0.2 |
| Evaluation |  | Bleeding amount | ○ | ○ | ○ | ○ | ○ | ○ |
|  |  | Coatability | ○ | ○ | ○ | ○ | ○ | ○ |
|  |  | Comprehensive evaluation | ○ | ○ | ○ | ○ | ○ | ○ |

TABLE 5

|  |  |  | Comparative Example 13 | Comparative Example 14 | Comparative Example 15 | Comparative Example 16 | Comparative Example 17 | Comparative Example 18 |
|---|---|---|---|---|---|---|---|---|
| Composition (parts by weight) | Curable compound | Polyether modified epoxy EX-861 | — | — | — | — | 10 | 10 |
|  |  | Polytetramethylene glycol modified epoxy (Epo gosei PT) | — | — | 2 | 2 | — | — |
|  |  | Resorcinol-type epoxy compound EX-201 | 7 | 7 | — | — | — | — |
|  |  | Flexible epoxy EXA-4850-150 | — | — | 8 | 8 | — | — |
|  |  | Flexible epoxy EXA-4850-1000 | 3 | 3 | — | — | — | — |
|  | Curing agent | Bifunctional acid anhydride curing agent YH-306 | 5 | 5 | — | — | — | — |
|  | Curing accelerator | Imidazole curing accelerator 2MA-OK | 0.8 | 0.8 | 0.8 | 0.8 | 0.8 | 0.8 |
|  | SP value of liquid portion |  | 12 | 12 | 13 | 13 | 14 | 14 |
|  | Inorganic fine particles | Surface phenyl group-treated nanosilica (M value: 30) | — | 0.3 | — | 0.2 | — | 0.2 |
|  |  | Fumed silica (MT-10, M value: 47) | 0.3 | 0.3 | 0.2 | 0.2 | 0.2 | 0.2 |
|  |  | Fumed silica (HM-20L, M value: 64) | 0.3 | — | 0.2 | — | 0.2 | — |
| Evaluation |  | Bleeding amount | x | ○ | x | ○ | x | ○ |
|  |  | Coatability | ○ | x | ○ | x | ○ | x |
|  |  | Comprehensive evaluation | x | x | x | x | x | x |

Example 15

To 100 parts by weight of the adhesive for electronic components produced in Example 7 was blended 0.1 parts by weight of spacer particles (micro pearl SP-210) having an average particle diameter of 10 μm and a CV value of 4%, followed by mixing under stirring with a homodisper to prepare an adhesive for electronic components.

The obtained adhesive for electronic components was charged into a 10-mL syringe (produced by Iwashita Engineering, Inc.) with a precision nozzle (produced by Iwashita Engineering, Inc., nozzle tip diameter: 0.3 mm) attached to the tip of the syringe, and then the adhesive was applied to a glass substrate at a discharging pressure of 0.4 MPa, a gap between a semiconductor chip and a needle of 200 μm, and an application amount of 5 mg with a dispenser apparatus (SHOT MASTER 300, produced by Musashi Engineering, Inc.). The application amount was set as follows:

(Application amount to periphery of bonded portion/application amount to center portion)=4.

After the application, a semiconductor chip (chip 1) including 172 pad openings with the size of 110 μm on the periphery (thickness: 80 μm, 8 mm×12 mm square, mesh pattern, aluminum wiring: thickness: 0.7 μm, L/S=15/15, thickness of surface silicon nitride film: 1.0 μm) was laminated on the application layer by pressing for five seconds at a pressure of 0.15 MPa with a flip chip bonder (DB-100, produced by SHIBUYA KOGYO CO., LTD). Next, the adhesive for electronic components was applied to the chip 1 using the above dispenser apparatus. A semiconductor chip (chip 2) same as the chip 1 was mounted on the chip 1 using the above bonding apparatus so that the long side of the chip 1 and the long side of the chip 2 crossed each other, and then laminated by pressing for five seconds at a temperature of 25° C. and at 0.15 MPa. Thereafter, the adhesive for electronic components was cured by standing in a hot air drying apparatus at 80° C. for 60 minutes and then heating at 150° C. for 60 minutes, so that a semiconductor chip laminate was produced.

According to the above method, 10 semiconductor chip laminates were produced. The lamination state of each of the semiconductor chip laminates was observed with a laser displacement sensor (KS-1100, produced by KEYENCE CORP.). The chip distance between the chip 1 and the chip 2 was obtained by measuring the step between the upper surface of the chip 1 and the upper surface of the chip 2 and then subtracting the chip thickness from the measured value. Variation of the chip distance was calculated as 3σ (σ: standard deviation). As the result, 3σ was 1.2.

On the other hand, in the case of producing the semiconductor chip laminates by the same method as described above with the adhesive for electronic components produced in Example 7 (the spacer particles were not added therein), the deviation of the chip distance was evaluated and 3σ was 7.8.

Each materials showed in Tables 1 to 5 was listed below.

(Curable Compound)

(1) Epoxy (A)

Resorcinol-type epoxy compound (EX-201, SP value: 12, produced by Nagase ChemteX Corp.)

(2) Epoxy (B)

NBR modified bis A-type epoxy compound (EPR-4030, SP value: 9, produced by ADEKA Corp.)

Flexible epoxy (EXA-4850-1000, SP value: 13, produced by Dainippon Ink and Chemicals, Inc.)

Flexible epoxy (EXA-4850-150, SP value: 13, produced by Dainippon Ink and Chemicals, Inc.)

Butadiene modified epoxy (R-45EPT, SP value: 8, produced by Nagase ChemteX Corp.)

Polyether modified epoxy (EX-861, SP value: 14, produced by Nagase ChemteX Corp.)

Polytetramethylene glycol modified epoxy (Epo-GOSEI PT, SP value: 13, produced by Yokkaichi Chemical Co., Ltd.)

(3) Other Epoxy

Dicyclopentadiene-type epoxy (EP-4088S, SP value: 9, produced by ADEKA Corp.)

Dicyclopentadiene-type epoxy (HP-7200HH, SP value: 9, produced by Dainippon Ink and Chemicals, Inc.)

Bisphenol A-type epoxy (YL-980, SP value: 11, produced by Japan Epoxy Resins Co., Ltd.)

(Curing Agent)

Bifunctional anhydride curing agent (YH-306, produced by Japan Epoxy Resins Co., Ltd., liquid at normal temperatures)

(Curing Accelerator)

Imidazole curing accelerator (2MA-OK, produced by SHIKOKU CHEMICALS Corp.)

(Inorganic Particles)

Fumed silica (QS-40, produced by TOKUYAMA Corp., average primary particle diameter: 7 nm, M value: 0, carbon content: 0% by weight)

Fumed silica (MT-10, produced by TOKUYAMA Corp., average primary particle diameter: 15 nm, M value: 47, carbon content: 0.9% by weight)

Fumed silica (HM-20L, produced by TOKUYAMA Corp., average primary particle diameter: 12 nm, M value: 64, carbon content: 2.4% by weight)

Fumed silica (PM-20L, produced by TOKUYAMA Corp., average primary particle diameter: 12 nm, M value: 65, carbon content: 5.5% by weight)

Surface epoxy group-treated nanosilica (UFP-80, produced by DENKI KAGAKU KOGYO K.K., average primary particle diameter: 34 nm, M value: 20)

Surface phenyl group-treated nanosilica (produced by Admatechs Co., Ltd., average primary particle diameter: 40 nm, M value: 30)

INDUSTRIAL APPLICABILITY

The present invention can provide an adhesive for electronic components, excellent in coatability, having high preventability of stains in bonded electronic components, and capable of providing highly reliable electronic components.

The invention claimed is:

1. A liquid adhesive for electronic components,
which contains:
a curable compound;
a curing agent; and
inorganic fine particles,
a liquid portion in the liquid adhesive having a solubility parameter (SP value) in the range of 8 to 11, including 8 and not including 11,
said inorganic fine particles including a mixture of at least inorganic fine particles (A) and inorganic fine particles (B),
the inorganic fine particles (A) having an average primary particle diameter of 50 nm or less and a hydrophobization degree (M value) in the range of 30 to 47, including 30 and 47, and
the inorganic fine particles (B) having an average primary particle diameter of 50 nm or less and a hydrophobization degree (M value) of 65 or more, wherein a blending amount of the inorganic fine particles (B) is 30 to 600 parts by weight to 100 parts by weight of the inorganic fine particles (A), and wherein a total content of the inorganic fine particles (A) and the inorganic fine particles (B) is 2 to 20 parts by weight to 100 parts by weight of the curable compound.

2. A liquid adhesive for electronic components,
which contains:
a curable compound;
a curing agent; and
inorganic fine particles,
a liquid portion in the liquid adhesive having a solubility parameter (SP value) in the range of 11 to 12, including 11 and not including 12,
said inorganic fine particles including a mixture of at least inorganic fine particles (C) and inorganic fine particles (D),
the inorganic fine particles (C) having an average primary particle diameter of 50 nm or less and a hydrophobization degree (M value) in the range of 20 to 30, including 20 and 30, and
the inorganic fine particles (D) having an average primary particle diameter of 50 nm or less and a hydrophobization degree (M value) of 65 or more,
wherein a blending amount of the inorganic fine particles (D) is 30 to 600 parts by weight to 100 parts by weight of the inorganic fine particles (C), and
wherein a total content of the inorganic fine particles (C) and the inorganic fine particles (D) is 2 to 20 parts by weight to 100 parts by weight of the curable compound.

3. A liquid adhesive for electronic components,
which contains:
a curable compound;
a curing agent; and
inorganic fine particles,
a liquid portion in the liquid adhesive having a solubility parameter (SP value) in the range of 12 to 14, including 12 and 14,
said inorganic fine particles including a mixture of at least inorganic fine particles (E) and inorganic fine particles (F),
the inorganic fine particles (E) having an average primary particle diameter of 50 nm or less and a hydrophobization degree (M value) of 30 or less, and
the inorganic fine particles (F) having an average primary particle diameter of 50 nm or less and a hydrophobization degree (M value) of 64 or more,
wherein a blending amount of the inorganic fine particles (F) is 30 to 600 parts by weight to 100 parts by weight of the inorganic fine particles (E), and
wherein a total content of the inorganic fine particles (E) and the inorganic fine particles (F) is 2 to 20 parts by weight to 100 parts by weight of the curable compound.

4. The adhesive for electronic components according to claim 1, 2, or 3,
wherein the liquid portion contains the curable compound and a liquid curing agent.

5. The adhesive for electronic components according to claim 1, 2, or 3,
wherein the curable compound contains an epoxy compound (A),
the epoxy compound (A) having a molecular structure containing 10 or less monomer units with an aromatic ring in a repeating unit, being in a state of crystalline solid at 25° C., and having a viscosity of 1 Pa·s or less measured by an E-type viscometer at a temperature of 50 to 80° C.

6. The adhesive for electronic components according to claim 1, 2, or 3,
wherein the curable compound contains an epoxy compound (B),
the epoxy compound (B) having an epoxy group at each molecular end and having a flexible skeleton with a number average molecular weight of 50 to 1000 between one of the epoxy groups and the other epoxy group.

7. The adhesive for electronic components according to claim 6,
wherein the epoxy compound (B) has a butadiene skeleton.

8. The adhesive for electronic components according to claim 1, 2, or 3,
which further contains spacer particles having a CV value of 10% or less.

* * * * *